US012130315B2

(12) United States Patent
Takada et al.

(10) Patent No.: US 12,130,315 B2
(45) Date of Patent: Oct. 29, 2024

(54) CONTROL APPARATUS, IDENTIFYING APPARATUS, CONTROL METHOD, IDENTIFYING METHOD AND PROGRAM

(71) Applicant: Nippon Telegraph and Telephone Corporation, Tokyo (JP)

(72) Inventors: Hidetoshi Takada, Musashino (JP); Toshimitsu Tanaka, Musashino (JP); Toshihiro Hayashi, Musashino (JP); Naoki Hanaoka, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 352 days.

(21) Appl. No.: 17/774,570

(22) PCT Filed: Nov. 6, 2019

(86) PCT No.: PCT/JP2019/043534
§ 371 (c)(1),
(2) Date: May 5, 2022

(87) PCT Pub. No.: WO2021/090411
PCT Pub. Date: May 14, 2021

(65) Prior Publication Data
US 2022/0404404 A1 Dec. 22, 2022

(51) Int. Cl.
G01R 25/00 (2006.01)
G05B 19/042 (2006.01)
H02J 3/38 (2006.01)

(52) U.S. Cl.
CPC ........... *G01R 25/00* (2013.01); *G05B 19/042* (2013.01); *H02J 3/381* (2013.01); *G05B 2219/2639* (2013.01)

(58) Field of Classification Search
CPC ........... G05B 19/042; G05B 2219/2639; H02J 3/381; H02J 13/0001; G01R 25/00; G05F 1/70; H04B 3/54
See application file for complete search history.

(56) References Cited

U.S. PATENT DOCUMENTS

2005/0111560 A1* 5/2005 Haines ............... H04B 3/56
375/257
2007/0073420 A1* 3/2007 Lanni ............... G05F 1/00
700/22

(Continued)

FOREIGN PATENT DOCUMENTS

JP 201195059 5/2011
WO WO 2018128109 7/2018

OTHER PUBLICATIONS

Itami, "Profitable mega solar technology course that can be read by QA <5th> Is there any role or function of the power conditioner other than changing the generated power from direct current to alternating current? (Bottom)," Nikkel xTech, Jan. 15, 2014, retrieved from URL <https://tech.nikkeibp.co.jp/dm/article/FEATURE/20140114/327140/>, 15 pages (with English Translation).

*Primary Examiner* — Christopher W Carter
(74) *Attorney, Agent, or Firm* — Fish & Richardson P.C.

(57) ABSTRACT

There are included: generation means for generating predetermined information represented by a bit string; and control means for controlling a phase difference between current and voltage of AC power at predetermined time intervals so that each bit value included in the bit string is represented.

5 Claims, 4 Drawing Sheets

(56) References Cited

U.S. PATENT DOCUMENTS

| | | | |
|---|---|---|---|
| 2013/0093263 A1* | 4/2013 | Lanni | H02J 7/00309 |
| | | | 307/151 |
| 2013/0147279 A1* | 6/2013 | Muratov | H02J 7/00036 |
| | | | 307/104 |
| 2019/0356132 A1* | 11/2019 | Fujimura | H02J 13/0001 |

* cited by examiner

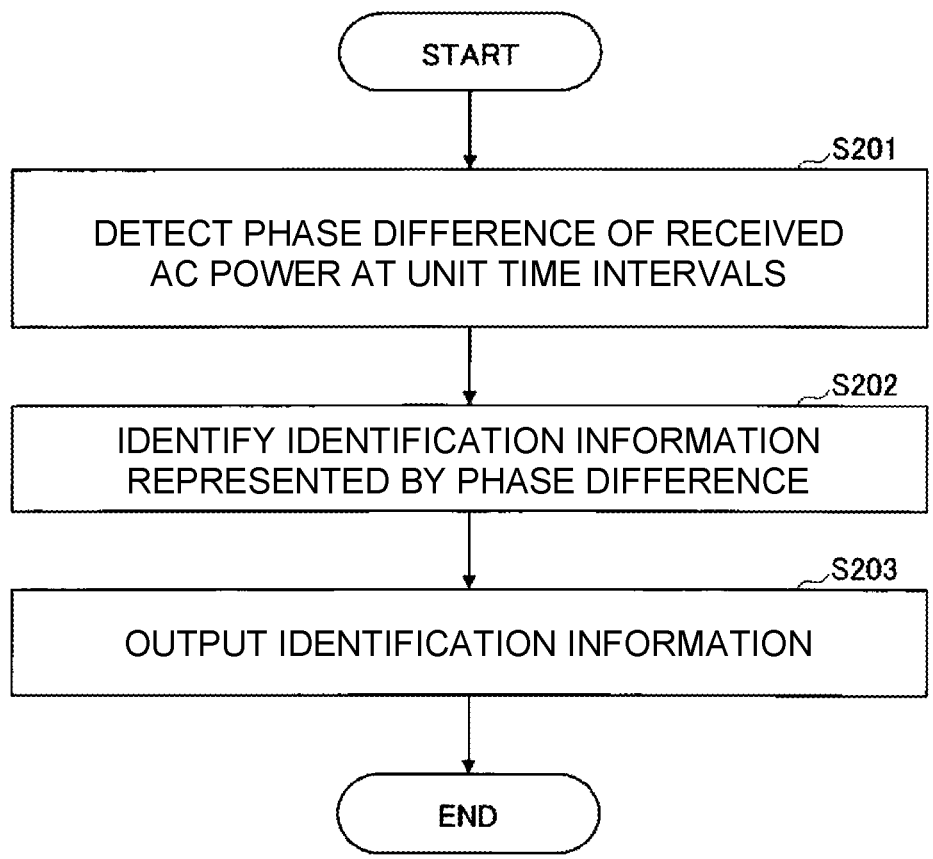

CONTROL APPARATUS, IDENTIFYING APPARATUS, CONTROL METHOD, IDENTIFYING METHOD AND PROGRAM

CROSS-REFERENCE TO RELATED APPLICATIONS

This application is a National Stage application under 35 U.S.C. § 371 of International Application No. PCT/JP2019/043534, having an International Filing Date of Nov. 6, 2019. The disclosure of the prior application is considered part of the disclosure of this application, and is incorporated in its entirety into this application.

TECHNICAL FIELD

The present invention relates to a control device, an identification device, a control method, an identification method and a program.

BACKGROUND ART

Power generated from various power sources (e.g., solar panels, wind power generation devices, hydro power generation devices, thermal power generation devices, and nuclear power generation devices) is generally transmitted and distributed to consumers (e.g., ordinary homes, factories, and offices) as AC power. For this reason, inverters and power conditioners that convert DC power input from a power source into AC power have conventionally been known (see, e.g., Non-Patent Literature 1).

On the other hand, in recent years, with the increase in environmental awareness of such matters as carbon reduction, some consumers desire power transmission and distribution from certain types of power sources (e.g., power sources that can generate power from renewable energy, such as solar panels, wind power generation devices, and hydro power generation devices). For this reason, a mechanism has been awaited that makes it possible to identify from which power source the power has been transmitted and distributed on the power reception side (e.g., consumers) as well.

CITATION LIST

Non-Patent Literature

Non-Patent Literature 1: "Profitable mega solar technology course that can be read and understood through Q&A <5th installment>: Is there any role or function of the power conditioner other than converting the generated power from direct current to alternating current? (Part 2/2)", [online], Internet <URL: https://tech.nikkeibp.co.jp/dm/article/FEATURE/20140114/327140/>

SUMMARY OF THE INVENTION

Technical Problem

However, in order to make it possible to identify from which power source the power has been transmitted and distributed on the power reception side as well, for example, it is necessary to transmit information for identifying the power source from the power transmission side to the power reception side via an information communication network (e.g., the Internet) that is different from the power transmission and distribution network. Accordingly, in this case, it is necessary to prepare communication facilities for connecting to the information communication network both on the power transmission side and the power reception side.

An embodiment of the present invention has been made in view of the above points, and aims to transmit information from a power transmission side to a power reception side via a power transmission and distribution network.

Means for Solving the Problem

In order to achieve the above purpose, a control device according to this embodiment includes: generation means for generating predetermined information represented by a bit string; and control means for controlling a phase difference between current and voltage of AC power at predetermined time intervals so that each bit value included in the bit string is represented.

Effects of the Invention

It is possible to transmit information from a power transmission side to a power reception side via a power transmission and distribution network.

BRIEF DESCRIPTION OF DRAWINGS

FIG. 5 is a flowchart showing an example of information identification processing according to this embodiment.

DESCRIPTION OF EMBODIMENTS

Hereinafter, an embodiment of the present invention will be described. In this embodiment, a control system 1 will be described that is capable of transmitting information from a power transmission side to a power reception side via a power transmission and distribution network by controlling a phase difference between current and voltage of AC power. Here, in this embodiment, as an example, it is assumed that the information transmitted from the power transmission side to the power reception side is identification information for identifying a power source (e.g., a power source ID). This makes it possible to identify the type of the power source on the power reception side. Note that types of power sources include, for example, solar panels, wind power generation devices, hydro power generation devices, thermal power generation devices, and nuclear power generation devices.

However, the information transmitted from the power transmission side to the power reception side is not limited to the identification information of the power source, but may be any information. For example, the information transmitted from the power transmission side to the power reception side may be identification information identifying the type of the power source, or may be various other types of information (e.g., information indicating an electricity charge, or information for controlling equipment or the like on the power reception side).

<Overall Configuration of Control System 1>

Figure 1:
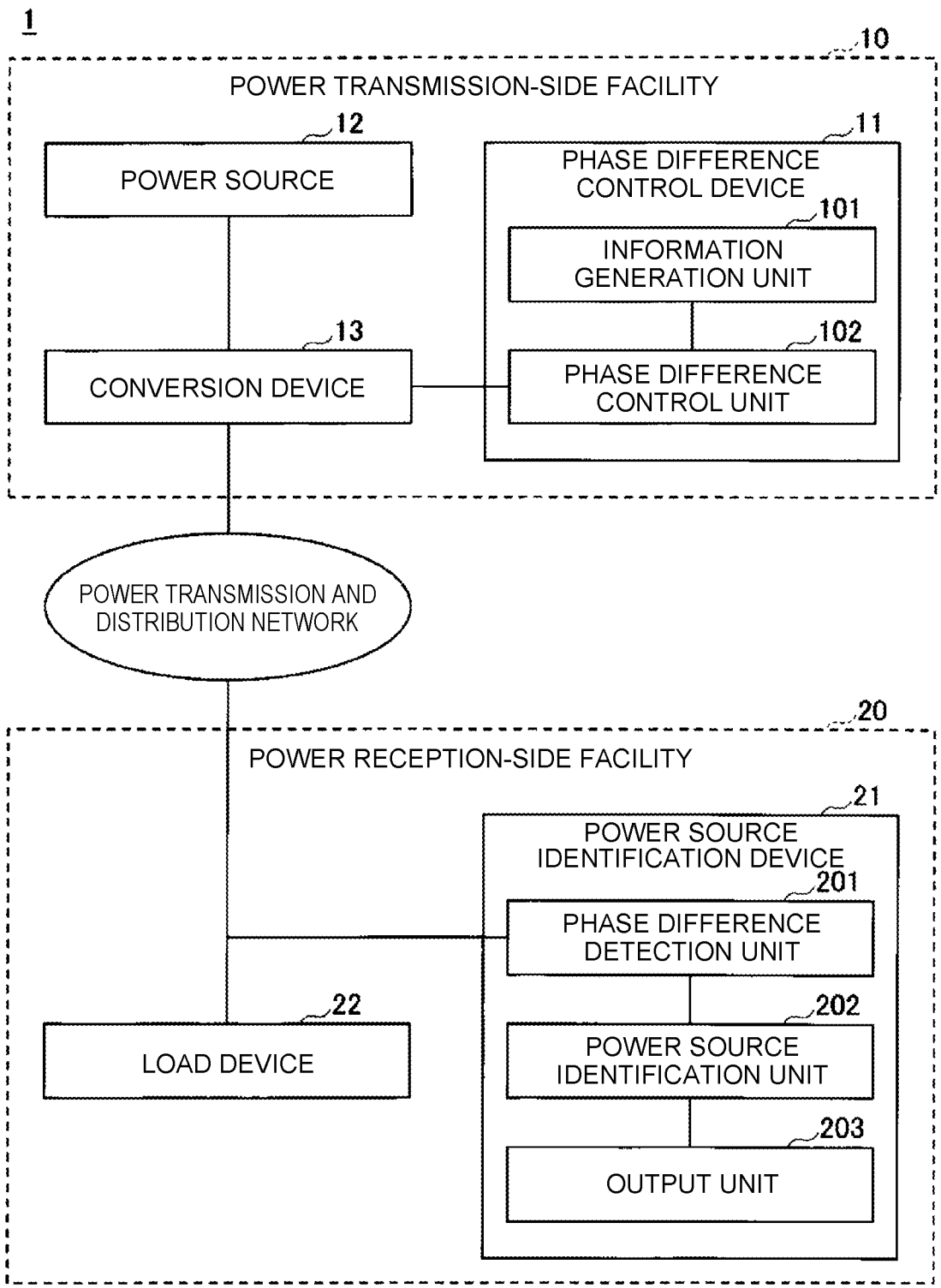
FIG. 1 is a diagram showing an example of the overall configuration of a control system according to this embodiment.

First, the overall configuration of the control system 1 according to this embodiment will be described with reference to FIG. 1. FIG. 1 is a diagram showing an example of the overall configuration of the control system 1 according to this embodiment.

As shown in FIG. 1, the control system 1 according to this embodiment includes a power transmission-side facility 10 and a power reception-side facility 20. The power transmission-side facility 10 can transmit power to the power reception-side facility 20 via the power transmission and distribution network.

The power transmission-side facility 10 is a facility on the power transmission side, and includes a phase difference control device 11, a power source 12, and a conversion device 13.

The power source 12 is a device, equipment, or the like that produces DC power (that is, generates power). Examples of the power source 12 include, for example, a solar panel, a wind power generation device, a hydro power generation device, a thermal power generation device, or a nuclear power generation device.

The conversion device 13 is a device that converts the DC power generated by the power source 12 into AC power, and then transmits the power to the power transmission and distribution network. For example, an inverter or a power conditioner can be used as the conversion device 13.

The phase difference control device 11 is a device that controls a phase difference between current and voltage of the AC power obtained by conversion in the conversion device 13. Here, the phase difference control device 11 includes an information generation unit 101 and a phase difference control unit 102. Each of these units is implemented by, for example, processing that one or more programs installed in the phase difference control device 11 cause a processor such as a CPU (central processing unit) to execute.

The information generation unit 101 generates predetermined information (in this embodiment, identification information of the power source 12). The phase difference control unit 102 controls a phase difference between current and voltage of the AC power obtained by conversion in the conversion device 13 so that the information generated by the information generation unit 101 is represented. Details of a method of representing the information by controlling the phase difference will be described later.

Further, the power reception-side facility 20 is a facility on the power reception side, and includes a power source identification device 21 and a load device 22.

The load device 22 is a device that is driven by the AC power received from the power transmission and distribution network (or DC power obtained by rectifying this AC power). Specific examples of the load device 22 include, for example, various home electric appliances, various types of industrial equipment in factories or the like, and various types of office equipment in offices or the like.

The power source identification device 21 is a device that identifies the information from a phase difference between current and voltage of the AC power received from the power transmission and distribution network. Here, the power source identification device 21 includes a phase difference detection unit 201, a power source identification unit 202, and an output unit 203.

The phase difference detection unit 201 detects a phase difference between current and voltage of the AC power received from the power transmission and distribution network. The power source identification unit 202 identifies the information represented by the phase difference detected by the phase difference detection unit 201 (in this embodiment, the identification information of the power source 12). The output unit 203 outputs the identification information identified by the power source identification unit 202 to a predetermined output destination. Note that although the output destination of the output unit 203 can be any output destination, it can be, for example, an indication device such as a display, or an auxiliary storage device such as an HDD (hard disk drive) or an SSD (solid state drive).

Note that the configuration of the control system 1 shown in FIG. 1 is an example, and may be other configurations. For example, the control system 1 may include a facility owned by a prosumer of power. In this case, the facility is both a power transmission-side facility and a power reception-side facility, so that it includes the phase difference control device 11, the power source 12, the conversion device 13, the power source identification device 21, and the load device 22.

<Method of Representing Information by Controlling Phase Difference>

Figure 2:
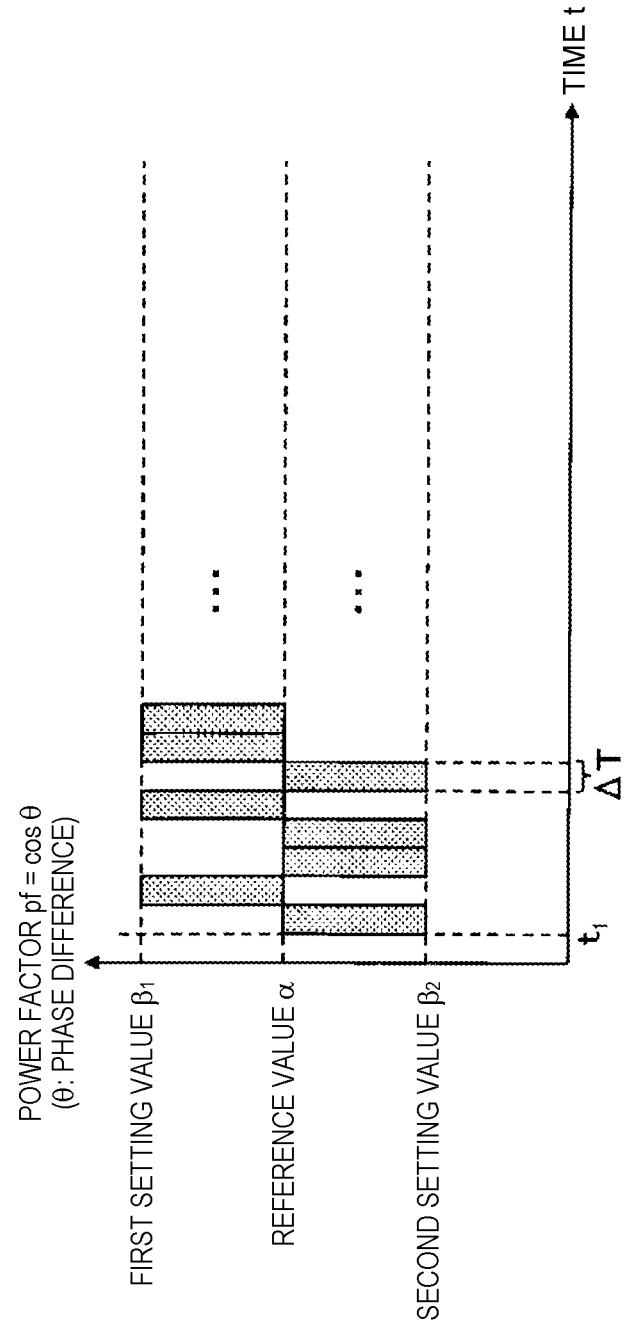
FIG. 2 is a diagram for describing an example of a method of representing information by controlling a phase difference.

Here, a method of representing information by controlling a phase difference between current and voltage of AC power will be described with reference to FIG. 2. FIG. 2 is a diagram for describing an example of a method of representing information by controlling a phase difference.

Hereinafter, let a phase difference between current and voltage of AC power be $\theta$, a power factor be $pf=\cos \theta$, a reference value for the power factor pf be $\alpha$, a first setting value representing a bit value of "1" be $\beta_1$, and a second setting value representing a bit value of "0" be $\beta_2$. The reference value $\alpha$, the first setting value $\beta_1$ and the second setting value $\beta_2$ are preset values, and satisfy $0 \le \beta_2 \le \alpha < \beta_1 \le 1$. Note that the reference value $\alpha$, the first setting value $\beta_1$ and the second setting value $\beta_2$ can be set to any values satisfying $0 \le \beta_2 < \alpha < \beta_1 \le 1$: for example, $\alpha=0.85$, $\beta_1=0.90$, and $\beta_2=0.80$.

At this time, the phase difference control unit 102 represents each bit value of the information generated by the information generation unit 101 by controlling the phase difference $\theta$ so that the power factor pf becomes either the first setting value $\beta_1$ or the second setting value $\beta_2$ at predetermined unit time intervals $\Delta T$.

Specifically, for example, when the information generated by the information generation unit 101 is represented by an 8-bit bit string "01001011", the phase difference control unit 102 controls the phase difference $\theta$ so that the power factor pf becomes $\beta_2$, $\beta_1$, $\beta_2$, $\beta_2$, $\beta_1$, $\beta_2$, $\beta_1$, and $\beta_1$ in this order at unit time intervals $\Delta T$. That is, in this case, as shown in FIG. 2, the phase difference control unit 102 controls the phase difference $\theta$ so that the power factor pf becomes the second setting value $\beta_2$ between a certain time $t_1$ and $t_1+\Delta T$. Similarly, the phase difference control unit 102 controls the phase difference $\theta$ so that the power factor pf between times $t_1+\Delta T$ and $t_1+2\Delta T$ becomes the first setting value $\beta_1$. Similarly thereafter, the phase difference control unit 102 controls the phase difference $\theta$ so that the power factor pf between times $t_1+2\Delta T$ and $t_1+3\Delta T$ becomes the second setting value $\beta_2$, the power factor pf between times $t_1+3\Delta T$ and $t_1+4\Delta T$ becomes the second setting value $\beta_2$, the power factor pf between times $t_1+4\Delta T$ and $t_1+5\Delta T$ becomes the first setting value $\beta_1$, the power factor pf between times $t_1+5\Delta T$ and $t_1+6\Delta T$ becomes the second setting value $\beta_2$, the power factor pf between times $t_1+6\Delta T$ and $t_1+7\Delta T$ becomes the first setting value $\beta_1$, and the power factor pf between times $t_1+7\Delta T$ and $t_1+8\Delta T$ becomes the first setting value $\beta_1$.

In this way, in this embodiment, by controlling a phase difference θ between current and voltage of AC power at unit time intervals $\Delta T$, any information represented by a bit string can be represented. That is, in this embodiment, any information represented by a bit string can be embedded in AC power.

Note that although the first setting value $\beta_1$ represents a bit value of "1", and the second setting value $\beta_2$ represents a bit value of "0" in the example shown in FIG. 2, this is merely an example; the first setting value $\beta_1$ may represent a bit value of "0", and the second setting value $\beta_2$ may represent a bit value of "1". However, it is necessary to determine between the phase difference control device 11 and the power source identification device 21 in advance the bit value the first setting value $\beta_1$ and the second setting value $\beta_2$ each represent.

<Hardware Configurations of Phase Difference Control Device 11 and Power Source Identification Device 21>

Figure 3:
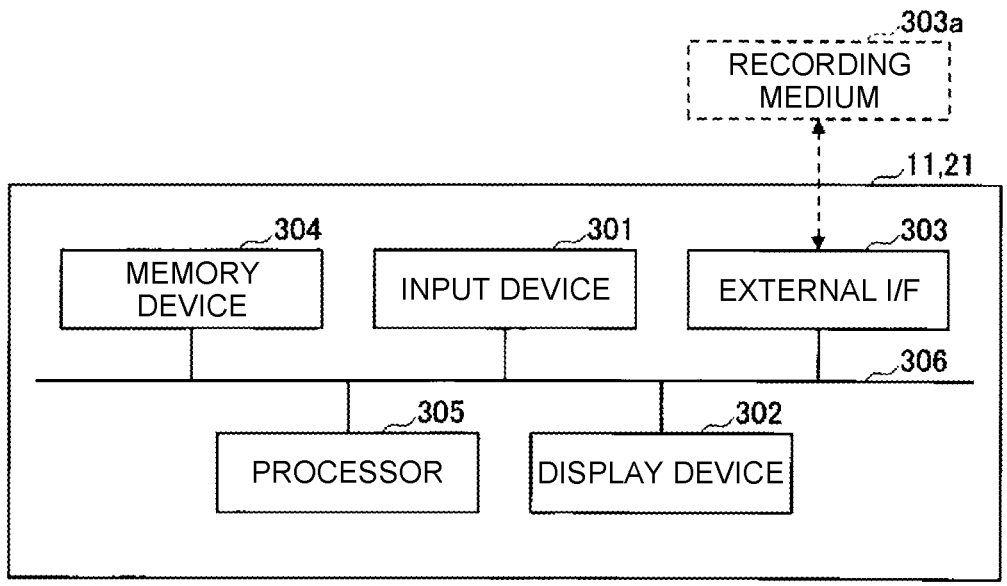
FIG. 3 is a diagram showing an example of hardware configurations of a phase difference control device and a power source identification device according to this embodiment.

Next, hardware configurations of the phase difference control device 11 and the power source identification device 21 according to this embodiment will be described with reference to FIG. 3. FIG. 3 is a diagram showing an example hardware configuration of the phase difference control device 11 and the power source identification device 21 according to this embodiment. Note that since the phase difference control device 11 and the power source identification device 21 can be implemented by a similar hardware configuration, the hardware configuration of the phase difference control device 11 will mainly be described below.

As shown in FIG. 3, the phase difference control device 11 according to this embodiment has an input device 301, a display device 302, an external I/F 303, a memory device 304, and a processor 305. These pieces of hardware are communicably connected to each other via a bus 306.

The input device 301 is, for example, a keyboard, a mouse, a touch panel, or various types of operation buttons. The display device 302 is, for example, a display. Note that the phase difference control device 11 do not have to have at least one of the input device 301 and display device 302.

The external I/F 303 is an interface to external devices such as a recording medium 303a. Examples of the recording medium 303a include, for example, CDs, DVDs, SD memory cards, and USB memories.

The memory device 304 is, for example, various types of storage devices such as a RAM (random access memory), a ROM (read only memory), a flash memory, an HDD, and an SSD. The processor 305 is, for example, various types of arithmetic devices such as a CPU.

The phase difference control device 11 according to this embodiment can implement the phase difference control processing described later by having the hardware configuration shown in FIG. 3. Similarly, the power source identification device 21 according to this embodiment can implement the information identification processing described later by having the hardware configuration shown in FIG. 3.

Note that the hardware configuration shown in FIG. 3 is merely an example, and the phase difference control device 11 and the power source identification device 21 according to this embodiment may have other hardware configurations. For example, the phase difference control device 11 and the power source identification device 21 may have a communication I/F for connecting to an information communication network such as the Internet. Further, for example, the phase difference control device 11 and the power source identification device 21 may have a plurality of memory devices 304, and may have a plurality of processors 305.

<Phase Difference Control Processing>

Figure 4:
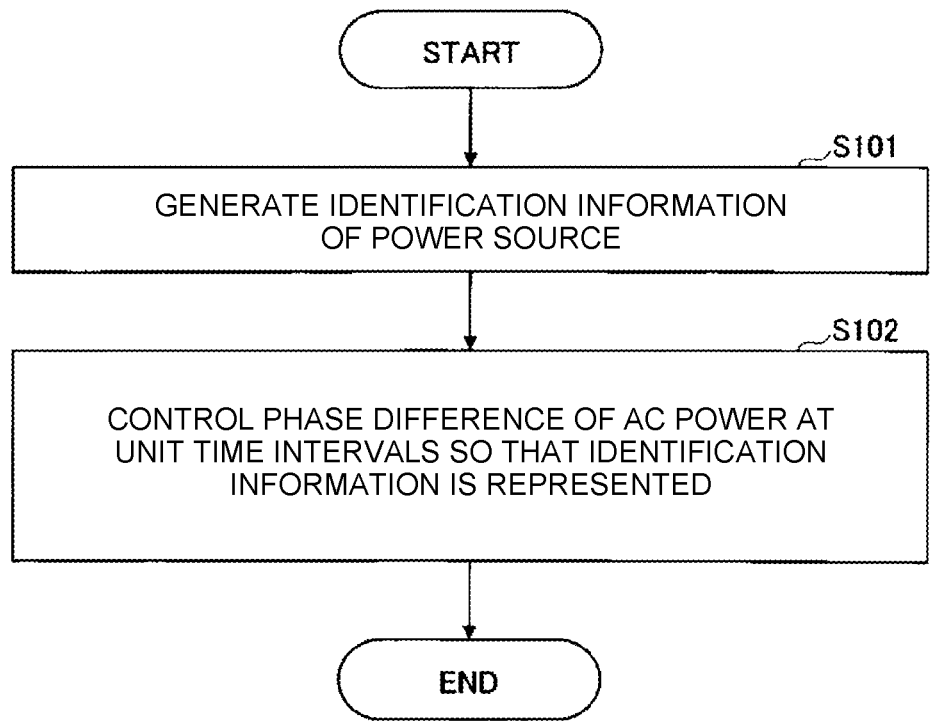
FIG. 4 is a flowchart showing an example of phase difference control processing according to this embodiment.

Next, the phase difference control processing executed by the phase difference control device 11 when the power transmission-side facility 10 transmits AC power to the power transmission and distribution network will be described with reference to FIG. 4. FIG. 4 is a flowchart showing an example of the phase difference control processing according to this embodiment.

First, the information generation unit 101 of the phase difference control device 11 generates identification information of the power source 12 (step S101).

Next, the phase difference control unit 102 of the phase difference control device 11 controls the phase difference θ between current and voltage of AC power obtained by conversion in the conversion device 13 at unit time intervals $\Delta T$ so that the identification information generated in step S101 above is represented (step S102). That is, the phase difference control unit 102 represents each bit value of the identification information by controlling the phase difference θ so that the power factor pf becomes either the first setting value $\beta_1$ or the second setting value $\beta_2$ at unit time intervals $\Delta T$ as described in <Method of Representing Information by Controlling Phase Difference> described above. Thus, AC power representing the identification information generated in step S101 above (i.e., AC power in which the identification information is embedded) can be transmitted by the conversion device 13 to the power transmission and distribution network.

Note that, for example, after a start bit string representing the start of the identification information and an end bit string representing the end of the identification information are determined in advance between the phase difference control device 11 and the power source identification device 21, the phase difference control unit 102 may control the phase difference θ at unit time intervals $\Delta T$ so that the start bit string is represented before step S102 above, and control the phase difference θ at unit time intervals $\Delta T$ so that the end bit string is represented after step S102 above. Alternatively, for example, except when the identification information is transmitted, controlling the phase difference θ so that a predetermined bit string (e.g., an all-'0' bit string or an all-'1' bit string) is represented may be determined in advance between the phase difference control device 11 and the power source identification device 21. In this way, a protocol for identifying desired information (in this embodiment, identification information) from among bit strings represented by AC power is determined in advance between the phase difference control device 11 and the power source identification device 21.

<Information Identification Processing>

Next, information identification processing executed by the power source identification device 21 when the power reception-side facility 20 has received AC power from the power transmission and distribution network will be described with reference to FIG. 5. FIG. 5 is a flowchart showing an example of information identification processing according to this embodiment.

The phase difference detection unit 201 of the power source identification device 21 detects a phase difference θ between current and voltage of AC power received from the power transmission and distribution network at unit time intervals $\Delta T$ (step S201).

Next, the power source identification unit 202 of the power source identification device 21 identifies the identification information (i.e., the identification information of the power source 12) represented by the phase difference θ detected in step S201 above (step S202). That is, the power source identification unit 202 calculates the power factor pf of each phase difference θ detected at unit time intervals ΔT, and then determines whether these power factors pf are the first setting value $\beta_1$ or the second setting value $\beta_2$, thereby obtaining the bit value at unit time intervals ΔT. Then, the power source identification unit 202 identifies the identification information of the power source 12 from among the strings of these bit values (i.e., bit strings). Thus, the identification information embedded in AC power is obtained.

Note that the power source identification unit 202 can identify the identification information from among the bit strings according to a protocol determined in advance with the phase difference control device 11. For example, when the start bit string and the end bit string have been determined between the phase difference control device 11 and the power source identification device 21, the power source identification unit 202 can identify a bit string between the start bit string and the end bit string among the bit strings as the identification information.

Next, the output unit 203 of the power source identification device 21 outputs the identification information identified in step S202 above to a predetermined output destination (step S203). Thus, the identification information of the power source 12 is output to the output destination. Note that the output unit 203 may output information corresponding to the identification information identified in step S202 above (e.g., the name of the power source 12 identified by the identification information, or the name of the type of the power source 12).

The present invention is not limited to the above embodiment specifically disclosed, and various variations, modifications, and the like can be made without departing from the description in the scope of claims.

REFERENCE SIGNS LIST

1 Control system
11 Phase difference control device
12 Power source
13 Conversion device
21 Power source identification device
22 Load device
101 Information generation unit
102 Phase difference control unit
201 Phase difference detection unit
202 Power source identification unit
203 Output unit

The invention claimed is:

1. A control device comprising:
an information generation unit, including one or more processors, configured to generate predetermined information represented by a bit string; and
a phase difference control device, including one or more processors, configured to control a phase difference between current and voltage of Alternating Current (AC) power at predetermined time intervals so that each bit value included in the bit string is represented and so that a power factor of the AC power becomes either a first value corresponding to a bit value of "1" or a second value corresponding to a bit value of "0" according to each bit value included in the bit string.

2. The control device according to claim 1, wherein
the information generation unit is configured to generate information for identifying a power source of the AC power as the information.

3. A method comprising:
generating predetermined information represented by a bit string; and
controlling a phase difference between current voltage of Alternating Current (AC) power at predetermined time intervals so that each bit value included in the bit string is represented and so that a power factor of the AC power becomes either a first value corresponding to a bit value of "1" or a second value corresponding to a bit value of "0" according to each bit value included in the bit string.

4. A non-transitory computer readable medium storing one or more instructions causing a computer to execute:
generating predetermined information represented by a bit string; and
controlling a phase difference between current and voltage of Alternating Current (AC) power at predetermined time intervals so that each bit value included in the bit string is represented and so that a power factor of the AC power becomes either a first value corresponding to a bit value of "1" or a second value corresponding to a bit value of "0" according to each bit value included in the bit string.

5. The non-transitory computer readable medium according to claim 4, further comprising:
generating information for identifying a power source of the AC power as the information.

* * * * *